(12) United States Patent
Nihtianov

(10) Patent No.: US 10,678,147 B2
(45) Date of Patent: Jun. 9, 2020

(54) MEASUREMENT SYSTEMS, LITHOGRAPHIC APPARATUS, DEVICE MANUFACTURING METHOD AND A METHOD OF MEASURING

(71) Applicant: ASML Netherlands B.V., Veldhoven (NL)

(72) Inventor: Stoyan Nihtianov, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 4 days.

(21) Appl. No.: 15/738,695

(22) PCT Filed: May 31, 2016

(86) PCT No.: PCT/EP2016/062207
§ 371 (c)(1),
(2) Date: Dec. 21, 2017

(87) PCT Pub. No.: WO2017/005408
PCT Pub. Date: Jan. 12, 2017

(65) Prior Publication Data
US 2018/0173115 A1      Jun. 21, 2018

(30) Foreign Application Priority Data
Jul. 8, 2015 (EP) .................................. 15175809

(51) Int. Cl.
*G03F 7/20* (2006.01)
*G01N 27/90* (2006.01)
(Continued)

(52) U.S. Cl.
CPC ......... *G03F 7/70775* (2013.01); *G01B 7/023* (2013.01); *G01D 5/202* (2013.01);
(Continued)

(58) Field of Classification Search
None
See application file for complete search history.

(56) References Cited

U.S. PATENT DOCUMENTS

| 5,525,903 A | 6/1996 | Mandl et al. |
| 7,173,417 B1 | 2/2007 | Poris et al. |

(Continued)

FOREIGN PATENT DOCUMENTS

| CN | 103743438 A | 4/2014 |
| DE | 4327712 A1 | 2/1995 |
| JP | 2005-024317 A | 1/2005 |

OTHER PUBLICATIONS

International Search Report and Written Opinion of the International Searching Authority directed to related International Patent Application No. PCT/EP2016/062207, dated Aug. 22, 2016; 11 pages.

(Continued)

*Primary Examiner* — Jermele M Hollington
*Assistant Examiner* — Suresh K Rajaputra
(74) *Attorney, Agent, or Firm* — Sterne, Kessler, Goldstein & Fox P.L.L.C.

(57) ABSTRACT

A measurement system for measuring a position and/or displacement of an object (40), the measurement system comprising a sensor (20) and a target (45), the sensor comprising an electromagnet (21); a driving circuit (24) configured to drive the electromagnet to generate an alternating magnetic field (AMF); a measuring circuit (25) configured to measure an electrical impedance parameter of the electromagnet; the target being located on a surface (41) of the object that faces the sensor, wherein the target comprises a graphene layer (46), and wherein, in use, when the alternating magnetic field interacts with the target, the (Continued)

alternating magnetic field changes (RMF), altering the electrical impedance parameter of the electromagnet.

16 Claims, 5 Drawing Sheets

(51) Int. Cl.
    *G01D 5/20*    (2006.01)
    *G01B 7/02*    (2006.01)

(52) U.S. Cl.
    CPC ....... *G01N 27/9033* (2013.01); *G03F 7/7085* (2013.01); *G03F 7/70625* (2013.01)

(56) References Cited

U.S. PATENT DOCUMENTS

| | | |
|---|---|---|
| 7,830,495 B2 | 11/2010 | Van Bruggen et al. |
| 8,476,896 B2 | 7/2013 | Mednikov |
| 2009/0015246 A1* | 1/2009 | Van Bruggen .......... G01D 5/145 324/207.22 |
| 2012/0019236 A1 | 1/2012 | Tiernan et al. |
| 2013/0020877 A1* | 1/2013 | Miller .................... B82Y 10/00 307/104 |
| 2014/0104587 A1* | 4/2014 | Freimann ............ G03F 7/70266 355/67 |
| 2015/0022198 A1 | 1/2015 | David et al. |

OTHER PUBLICATIONS

International Preliminary Report on Patentability directed to related International Patent Application No. PCT/EP2016/062207, dated Jan. 9, 2018; 7 pages.

Nihtianov S, "Measuring in the Subnanometer Range, Capacitive and Eddy Current Nanodisplacement Sensors," IEEE Industrial Electronics Magazine, vol. 8, No. 1, Mar. 2014; pp. 6-15.

* cited by examiner

MEASUREMENT SYSTEMS, LITHOGRAPHIC APPARATUS, DEVICE MANUFACTURING METHOD AND A METHOD OF MEASURING

FIELD

The present invention relates to measurement systems, a lithographic apparatus, a device manufacturing method, and a method of measuring using the measurement systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus comprises one or more objects that need to be positioned, e.g. a substrate table, a support structure to support a patterning device or an optical element. In order to accurately position the object, displacements and/or the position of the object must be accurately measured. Any error in the measurement of the displacements and/or position of the object may lead to the object being assumed to be in the wrong position or may lead to errors in positioning the object. It is desirable to accurately measure displacements and/or position of an object such that, for example, the object can be moved to a specific location.

Known measurement systems may include the use of an electromagnetic sensor. An electromagnetic sensor has a driving circuit configured to drive an electromagnet to generate an alternating magnetic field. If the electromagnetic sensor is close to the object the alternating magnetic field interacts with the object, and consequently the object affects the alternating magnetic field. Thus the presence of the object affects an electrical impedance parameter of the electromagnet in a manner that depends on the relative position of the object and the electromagnet. Thus location and/or movement of the object relative to the electromagnet can be detected as changes in the electrical impedance parameter. Thus the displacement and/or position of the object may be determined. However, errors in the distance measured by the electromagnetic sensor may be inherent in the measurement and it is desirable to reduce or prevent errors in the measurement of the displacement and/or position of the object.

SUMMARY

It is desirable, for example, to provide an improved measurement system that can accurately measure the displacement and/or position of an object.

According to an aspect of the invention, there is provided a measurement system for measuring a position and/or displacement of an object, the measurement system comprising a sensor and a target, the sensor comprising an electromagnet; a driving circuit configured to drive the electromagnet to generate an alternating magnetic field; and a measuring circuit configured to measure an electrical impedance parameter of the electromagnet; the target being located on a surface of the object that faces the sensor, wherein the target comprises a graphene layer, wherein, in use, when the alternating magnetic field interacts with the target, the alternating magnetic field changes, altering the electrical impedance parameter of the electromagnet.

According to an aspect of the invention, there is provided a measurement system for measuring a displacement and/or a position of an object, the measurement system comprising a sensor comprising an electromagnet; a graphene sensor layer located on the electromagnet; a driving circuit configured to drive the electromagnet to generate an alternating magnetic field; and a measuring circuit configured to measure an electrical impedance parameter of the electromagnet.

According to an aspect of the invention, there is provided a lithographic apparatus comprising a measurement system of any one of the claims.

According to an aspect of the invention, there is provided a device manufacturing method using the lithographic apparatus comprising a measurement system of any one of the claims.

According to an aspect of the invention, there is provided a method of measuring the position of an object using the measurement system of any one claims 1 to 16, the method comprising the steps of: driving the electromagnet to generate an alternating magnetic field; positioning the electromagnetic sensor relative to a target on an object such that the alternating magnetic field interacts with the target and changes the alternating magnetic field, altering the electrical impedance parameter of the electromagnet; measuring an electrical impedance parameter of the electromagnet; and determining the position of the object based on the electrical impedance parameter of the electromagnet.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
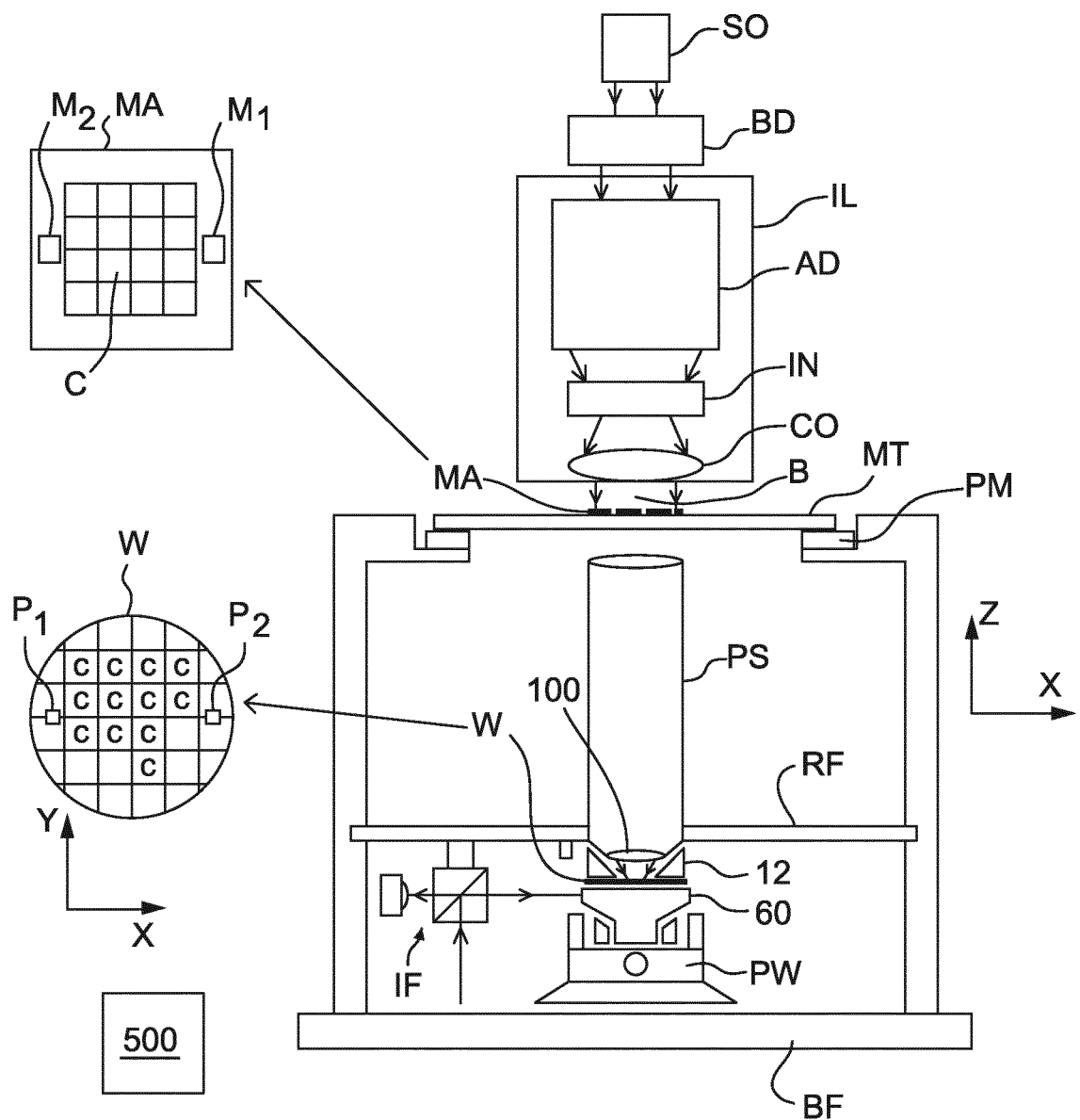
FIG. 1 schematically depicts a lithographic apparatus.

FIG. 1 schematically depicts a lithographic apparatus of an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate support apparatus 60 constructed to hold a substrate (e.g. a resist-coated production substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables. The lithographic apparatus may be of a type that has a measurement station, at which there are various sensors for characterizing a production substrate prior to exposure and an exposure station, at which the exposures are commanded out.

The lithographic apparatus is of a type wherein at least a portion of the substrate W may be covered by a immersion liquid 10 having a relatively high refractive index, e.g. water such as ultra pure water (UPW), so as to fill an immersion space 11 between the projection system PS and the substrate W. An immersion liquid 10 may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in immersion liquid 10; rather "immersion" only means that an immersion liquid 10 is located between the projection system PS and the substrate W during exposure. The path of the patterned radiation beam B from the projection system PS to the substrate W is entirely through immersion liquid 10.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam B is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing immersion liquid between a final optical element of the projection system PS and the substrate W can be classed into three general categories. These are the bath type arrangement, the so-called localized immersion systems and the all-wet immersion systems. An embodiment of the present invention relates particularly to the localized immersion systems.

Desirably, various components of the lithographic apparatus are accurately positioned. As such, accurate measurement systems are needed to accurately determine the position of components within the lithographic apparatus. Any errors induced in the measurement systems may lead to an error in the placement of one component relative to another which can lead to errors in the location of the patterned radiation beam B incident on the surface of the substrate W and can lead to overlay error.

The position of an object, which may be a component within the lithographic apparatus, may be measured using a measurement system as in the present invention, the measurement system comprising an electromagnetic sensor. For example, an eddy current sensor may be used. Eddy current sensors can be advantageous because they are fairly insensitive to local environmental changes. However, the measurement made by an eddy current sensor has inherent uncertainties in the way in which the measurement is carried out.

The electromagnetic sensor uses an electromagnet to provide an alternating magnetic field, in other words a magnetic field which varies in time. When the sensor is close to the object, the alternating magnetic field interacts with the object (if the object is conductive) and eddy currents are induced beneath the surface of the object. The eddy currents which are generated depend, amongst other things, on the strength of the alternating magnetic field. The closer the electromagnet is to the object, the higher the strength the alternating magnetic field will be in the object. The eddy currents in the object induce a resulting alternating magnetic field in the object. The resulting alternating magnetic field from the object interacts with the alternating magnetic field from the sensor. This induces changes in the alternating magnetic field of the sensor which alters an electrical impedance parameter of the electromagnetic sensor. Thus, the eddy currents cause a change of the electrical impedance parameter, e.g. the inductance, of the electromagnet. The alteration of the electrical impedance parameter can be measured and used to determine the distance of the object from the electromagnetic sensor or changes in the distance. As such, the position of the object may be determined in at least one degree of freedom. Electromagnetic sensors using eddy currents are known, as well as their use as displacement sensors, for example, as described in "Measuring in the Subnanometer Range: Capavitative and Eddy Current Nanodisplacement Sensors" by S. Nihtianov, IEEE Industrial Electronics Magazine (IEM), pp 6-15, Mar. 2014.

However, one of the main limiting factors determining the accuracy of an electromagnetic sensor using eddy currents in the nanometer and sub-nanometer ranges is the penetration depth, otherwise referred to as the skin depth ($\delta$), of the eddy currents in the object. The skin depth ($\delta$) is defined as:

$$\delta = \sqrt{\frac{2}{\omega_{exc}\mu\sigma}}$$

where $\mu$ is the object magnetic permeability, $\sigma$ is its electrical conductivity, and $\omega_{exc}=2\pi f_{exc}$ wherein $f_{exc}$ is the excitation frequency. The magnetic permeability and electrical conductivity are characterized by the material of the object, not the object itself.

Figure 2:
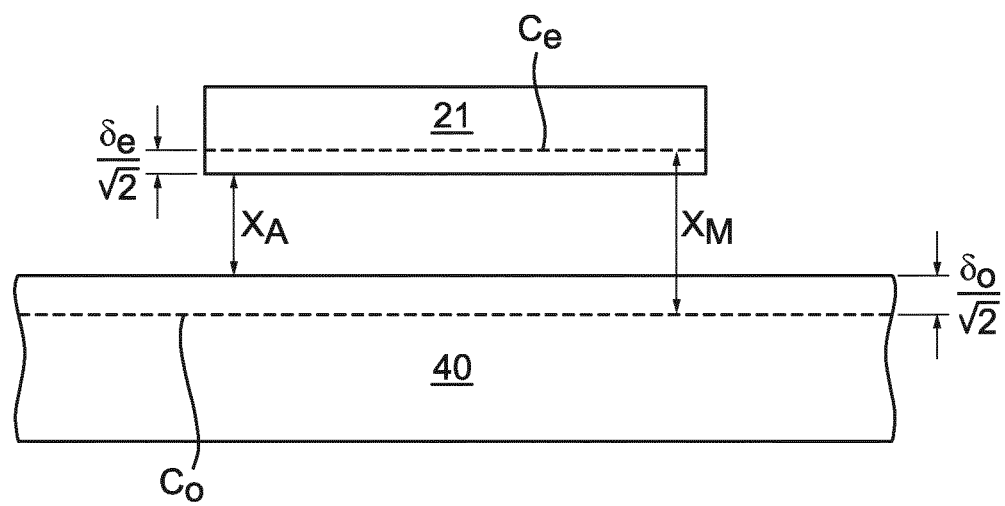
FIG. 2 depicts the distance measured between an object and a sensor by an electromagnetic sensor.

The standard skin depth ($\delta$) is defined as the depth at which the eddy current intensity reaches 1/e (i.e. approximately 37%) of its intensity at the object surface wherein "e" is a mathematical constant. When measuring small displacements or distances (for example, nanometer and/or sub-nanometer ranges), a skin depth ($\delta$) of tens or even hundreds of micrometers can creates a large error, even when the electromagnet of the sensor is almost touching the object. This is because the position of the object is identified by the center of density of the eddy currents (i.e. by an image plane), which is inside the object and not on its surface. The greater the skin depth ($\delta$), the greater the distance from the surface of the object to the center of density of the eddy currents. As the position of the object is measured to the center of density of the eddy currents and not the surface of the object, changes in the skin depth give false indications of changes of the position of the object relative to the electromagnetic sensor. The sensor can be used to measure a distance either directly or by measuring a displacement between an object and the sensor. For example, as depicted in FIG. 2, a sensor may be used to measure the distance X between the surface of a sensing coil and the surface of the object. Ideally, the sensor would measure the actual distance $X_A$. However, the sensor measures the distance $X_M$ between the image plane in the electromagnet and the image plane in the object. The image plane is the centre of density of the eddy currents and is related to the skin depth in that it is a distance of $$\frac{\delta}{\sqrt{2}}$$

from the surface. Therefore, instead of measuring $X_A$, the distance measured is:

$$X_A + \frac{\delta_o}{\sqrt{2}} + \frac{\delta_e}{\sqrt{2}}$$

wherein the depth of the image plane of the electromagnet of the sensor is at $$\frac{\delta_e}{\sqrt{2}}$$

and the depth at image plane of the object is at $$\frac{\delta_o}{\sqrt{2}}.$$

Furthermore, as the skin depth $\delta$ depends on conductivity of the object (or sensor), this changes due to temperature and therefore, has a variable error leading to an unstable sensor. Additionally, even if the skin depth is constant and can be accounted for by the measurement sensor, the skin depth may have a disproportionate effect on any measurement errors. Therefore, the skin depth may be one of the main sources of instability and low-resolution in an electromagnetic sensor.

According to the present invention there is proposed a measurement system for measuring a position of an object. The measurement system comprises an electromagnetic sensor to measure the position of an object. The sensor may be an electromagnetic sensor, and is referred to as such from hereon in. The measurement system further comprises a target located on a surface of the object that faces the target. In an embodiment, the measurement system measures the position of the object in a direction substantially perpendicular to a plane formed by the target on a surface of the object. As such, desirably the target is planar on the surface of the object.

Figure 3:
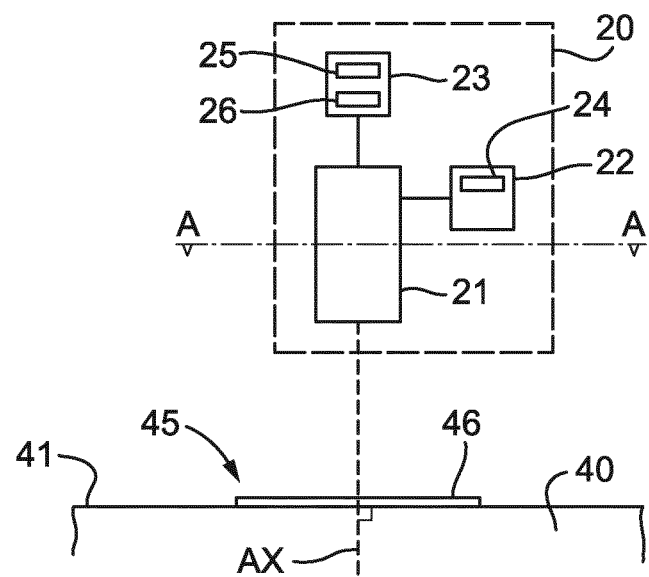
FIG. 3 depicts a measurement system in side view according to an embodiment.

A measurement sensor according to an exemplary embodiment of the invention is depicted in FIG. 3. The measurement system comprises an electromagnetic sensor 20 and a target 45, the electromagnetic sensor 20 comprising an electromagnet 21, a driving circuit 24 configured to drive the electromagnet 21 to generate an alternating magnetic field and a measuring circuit 25 configured to measure an electrical impedance parameter of the electromagnet 21 and the target 45 being located on an object 40, wherein the target 45 comprises a graphene layer 46, and wherein when the alternating magnetic field interacts with the target 45, the alternating magnetic field changes, altering the electrical impedance parameter of the electromagnet 21. The object may be made of a conductive material, a semiconductor, or an insulator. In an embodiment the target has a higher conductivity than the object.

Providing a target 45 on a surface 41 of the object 40 affects the resulting eddy currents. The target 45 can be used to decrease the skin depth (δ), thus reducing the distance between the surface of the object 40, and the center of density of the eddy currents used to identify the position of the object 40. This reduces the error in the position measurement and allows more accurate determination of the position of the object 40. The characteristics of the target 45 may be chosen to minimize the skin depth (δ), in order to improve accuracy of the measurement. Furthermore, if the object 40 is an insulator, the target 45 (having high conductivity), may be placed on the surface 41 of the object 40 to interact with the electromagnetic sensor 20.

Figure 4:
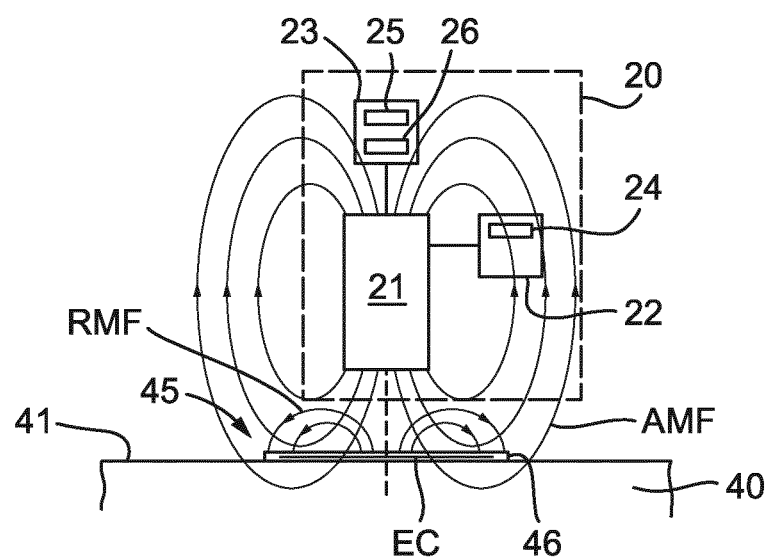
FIG. 4 depicts the electromagnetic sensor of FIG. 3, depicting an alternating magnetic field interacting with the target.

The electromagnetic sensor 20 comprises an electromagnet 21, a driving circuit 24 and a measuring circuit 25. The measuring circuit 25 may be located in a housing 23, which is optional. The driving circuit 24 is used to drive the electromagnet 21 to generate an alternating electromagnetic field, e.g. an alternating magnetic field. The driving circuit 24 may be located in a housing 22, which is optional. FIG. 4 depicts the alternating magnetic field AMF generated by the electromagnet 21, although the alternating magnetic field AMF is used and generated in the embodiments of the invention, it is not depicted in the remaining drawings to clearly show the features of the measurement system in the remaining drawings.

As depicted in FIG. 4, the alternating magnetic field AMF generates eddy currents EC in the target 45. FIG. 4 depicts exemplary eddy currents EC in the target 45 only. The eddy currents EC induce a resulting alternating magnetic field RMF in the target 45. This resulting alternating magnetic field RMF interacts with the alternating magnetic field AMF as described above.

In an embodiment, the driving circuit 24 is an electric circuit configured to provide an alternating current to the electromagnet 21. The alternating current through the electromagnet 21 induces the alternating magnetic field AMF. The driving circuit 24 may be used to control the characteristics, for example, the strength and/or frequency, of the alternating magnetic field AMF. The frequency $f_{exc}$ of the alternating current may be varied, however, it may be of the order of magnitude of 1 kHz to 1 GHz, preferably from 1 kHz to 10 kHz or from 10 kHz to 100 MHz. Alternatively, the frequency $f_{exc}$ may be even larger than 1 GHz. As described, the frequency affects the skin depth (δ). The larger the frequency, the smaller the skin depth (δ). Therefore, a higher frequency is preferable. For example, the frequency may preferably be higher than 100 kHz, or 1 MHz, or 10 MHz, or 100 MHz or even 1 GHz. However, this may require larger power to drive the electromagnet 21, therefore, it may be possible to provide a measurement system with a skin depth (δ) below an acceptable depth using the features of the present invention, which does not require the frequency to be as high as it may otherwise have to be, which can reduce the power required for the measurement system. For example, to reduce the power needed, it may be preferable to have a frequency of less than 1 MHz, or 100 kHz, or 10 kHz.

In an embodiment the measuring circuit 25 is used to determine a parameter of the electrical impedance of the electromagnet 21. The parameter may be determined by detecting parameters relating to the current through and/or voltage across the electromagnet 21, e.g. a current through the electromagnet 21, a ratio of a voltage over a current through the electromagnet 21, a magnitude of a drive current of the driving circuit 24 driving the electromagnet 21, or any other suitable parameter. Preferably, the determined parameter is the inductance.

The measurement system 20 may further comprise a processing unit 26 to determine the position of the object 40 using the measured electrical impedance. The processing unit 26 may comprise a controller, microprocessor, or any other processing device which is arranged to determine the position of the object 40. The processing unit 26 may be comprised in a controller or microprocessor having other functions in addition to determining the position of the object 40. The processing unit 26 is depicted in FIG. 3 as being located in the same housing 23 as the measuring circuit 25, however, the processing unit 26 and the measuring circuit 25 may be provided separately.

In an embodiment, the electromagnet 21 comprises a metal coil (not depicted in FIG. 3). Preferably, the metal coil is formed by closely spaced turns, in other words, the coil is tightly wound. Preferably, the electromagnetic sensor 20 further comprises a graphene sensor layer 48 as described in detail below.

The skin depth of a material determines the depth at which the eddy currents occur. The smaller the skin depth, the more precise the determination of the location of the eddy current. Eddy currents may also be generated in the material of the object below the target. The eddy currents within the object adversely affect the accuracy of the sensor. Accordingly, the target should be thick enough to serve as a shield so as to prevent eddy currents from occurring within the object itself, thin enough to be able to have eddy currents concentrated in the target, and the target should have a high enough electrical conductivity to generate large enough currents to be detectable.

Graphene combines both semiconductor and metal properties. In other words, graphene is a semiconductor with zero bandgap. Although graphene has fewer free carriers than metals, it has much higher electron mobility, for example may be approximately 200,000 square centimeters per Volt-second. Therefore, at higher frequencies the generated eddy currents can follow and/or cancel the external magnetic field much more efficiently with minimum losses due to the high mobility of electrons and holes. This reduces or prevents self heating amongst other advantages. Therefore, using the electromagnetic sensor at higher frequencies improves the associated advantages of using graphene. As such, when the excitation frequency is high enough, for example, of the order of a few GHz, the graphene layer may be very thin, for example, a mono-layer of graphene may be used. As such, the thickness of the graphene layer 46 may be approximately 1 nm to 10 nm. Alternatively, the graphene layer 46 may comprise several layers of graphene. In this embodiment, the graphene layer 46 may have a thickness in a range between 1 nm and 50 nm or more preferably in a range between 5 nm and 20 nm. If significantly more layers of graphene are used to form the graphene layer 46, the thickness may be higher. For example, in an embodiment, the thickness of the graphene layer 46 is less than or equal to approximately less than or equal to approximately 5 μm, preferably in a range between approximately 0.5 μm to 2 μm, or more preferably below approximately 0.5 μm.

In an embodiment, the thickness of the graphene layer 46 is substantially uniform. In other words, the thickness of the graphene layer 46 does not vary substantially in cross-section through the target 45, i.e. across the length or width of the target 45. In an embodiment wherein the graphene layer 46 is several layers of graphene, the graphene layer is substantially uniform and may include a variation of approximately 20% or less of the thickness of the graphene layer 46, or more preferably, the variation is approximately 10% or less. If the thickness of the graphene layer 46 is substantially uniform, the outer surface of the target 45, in other words, the surface of the graphene layer 46 that faces the electromagnet 21, is substantially parallel to a surface 41 of the object 40 on which the target 45 is located.

In an embodiment, the outer surface of the target 45, in other words, the surface of the graphene layer 46 that faces the electromagnet 21, is substantially flat. "Substantially flat" may mean that the roughness average Ra is approximately less than 100 nm, or more preferably 10 nm. Generally, if the roughness average Ra is less than 10%, preferably less than 1%, of the distance between the target 45 and the electromagnet 21, the effect due to the roughness is negligible. The roughness average $R_a$ being defined as the arithmetic average of absolute values and being calculated using the following equation:

$$R_a = \frac{1}{n}\sum_{i=1}^{n} |y_i|$$

wherein n is the number of data point used in the calculation, and y is the vertical surface position measured from an average surface height, the average surface height being the sum of the heights, divided by the number of points at which the height is measured.

Providing a target 45 comprising a graphene layer 46 has the advantage that it can be a very efficient shield against electromagnetic fields, to reduce or prevent eddy currents being generated in the object 40 below the graphene layer 46 due to the high electron mobility. This has several advantages. Firstly, the sensitivity of the measurement system may increase. Secondly, changes of the conductivity of the object 40 may have a reduced effect on the stability of the electromagnetic sensor 20. Thirdly, the skin depth (δ) of the eddy currents may be reduced. Therefore, if a given sensitivity of the sensor is required, it may be possible to reduce the excitation frequency without increasing the skin depth (δ) beyond an acceptable amount. Reducing the excitation frequency, for example, to below approximately 1 GHz, or more preferably to approximately 1 MHz to 100 Mz, may be beneficial in that the interface electronics may be simplified and power and/or heat dissipation may be reduced.

Furthermore, providing a target 45 with high conductivity means that energy losses in the target 45 may be lower. These losses are mainly due to resistive heating of the target 45 due to the eddy currents. By heating the target 45, its conductivity will change (i.e. it will decrease) and hence the skin depth will change (i.e. it will increase). This will result in variation of the skin depth, which may be called thermal drift, leading to a varying measurement error.

Preferably, the graphene layer 46 may be formed of a monolayer, i.e. a single atomic layer, of graphene, or more than one layer of graphene, i.e. several single atomic layers of graphene. Several single layers may mean any appropriate number of layers, for example, several may be 2 to 10 layers, or 3 to 5 layers. Several layers of graphene may be referred to as multi-layered graphene. It is preferable to use a monolayer of graphene to maintain high conductivity, however additional layers may be used, i.e. several layers, to prevent or further reduce eddy currents from being generated in the object 40 below the graphene layer 46. A monolayer of graphene may be useful if the alternating magnetic field AMF produced by the electromagnetic sensor 20 is weak because in this case, only a single monolayer may be needed to effectively reduce or prevent eddy currents in the object. The number of layers may be selected to reach a desired thickness of the overall target 45. Graphene has a high mobility of free carriers (electrons) which allow the generation of eddy currents with very low losses very close to the surface of the target 45. In other words, a large proportion, or ideally all of the alternating magnetic field AMF which interacts with the target 45 may cause the resulting alternating magnetic field RMF.

Figure 5:
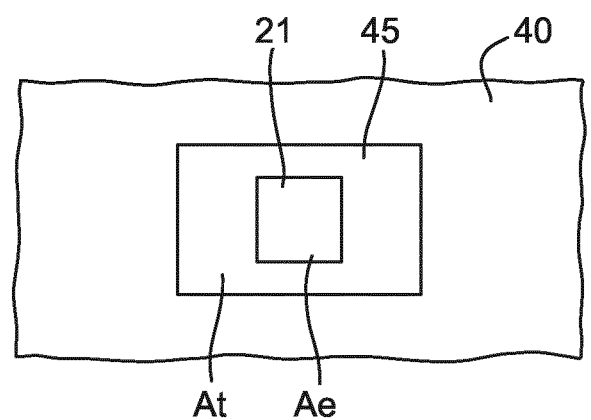
FIG. 5 in top view depicts the measurement system of FIG. 3 in cross-section A-A.

A measurement axis may be defined as perpendicular to the surface 41 of the object 40 being measured. The measurement axis AX is depicted in FIG. 3. The cross sectional area of the target At (see FIG. 5) and the cross-sectional area of the electromagnet Ae (see FIG. 5) may be determined as the area (in cross section) in a plane orthogonal to the measurement axis AX. In an embodiment, the cross-sectional area of the target At at surface 41 of the object 40 is larger than the cross-sectional area of the electromagnet Ae. A plan view is shown in FIG. 5 from cross-section AA in FIG. 3. As depicted in FIG. 5, the cross-sectional area of the target At is larger than the cross-sectional area of the electromagnet Ae. In an embodiment, the cross-sectional area of the target At is preferably 1.5 to 5 times larger than the cross-sectional area of the electromagnet Ae, or preferably the cross-sectional area of the target At is preferably 2-3 times larger than the cross-sectional area of the electromagnet Ae. Providing a target with a larger cross-sectional area At than the cross-sectional area of the electromagnet Ae means that higher sensitivity to the position of the target will be achieved, because it increases the interaction between the alternating magnetic field AMF and the target 45.

The graphene layer 46 may be provided on the object 40 by any appropriate means. In an embodiment, the graphene layer 46 is deposited on the surface of the object 40. For example, the graphene layer 46 may be deposited using chemical vapour deposition. The graphene layer 46 may be processed to achieve the desired thickness of the graphene layer 46. For example, the production, deposition and/or processing may comprise exfoliating the graphene layer 46, for example using a wedge-shaped tool, using adhesive tape, shearing, sonication, for example using a solvent, optionally with a surfactant, or two immiscible liquids, epitaxy, nanotube slicing, spin coating, supersonic spray, intercalation, using a laser, using microwave assisted oxidation, growing the target 45 on the object 40, reducing graphite oxide, using a carbon dioxide reduction, using sodium ethoxide pyrolysis, using a roll-to-roll manufacturing process and/or using the "Tang-Lau" method. The method of producing, depositing and/or processing the graphene layer 46 is not limiting.

If for any reason, the graphene layer 46 is incompatible with the surface of the object 40, it may be necessary to additionally provide an adhesive between the graphene layer 46 and the surface 41 of the object 40. In an embodiment an adhesion promoting layer is deposited on the object 40 and the graphene layer 46 is deposited on the adhesion promoting layer. The surface of the object 40 may be treated by chemical or physical means prior to deposition of the graphene layer 46.

Figure 6:
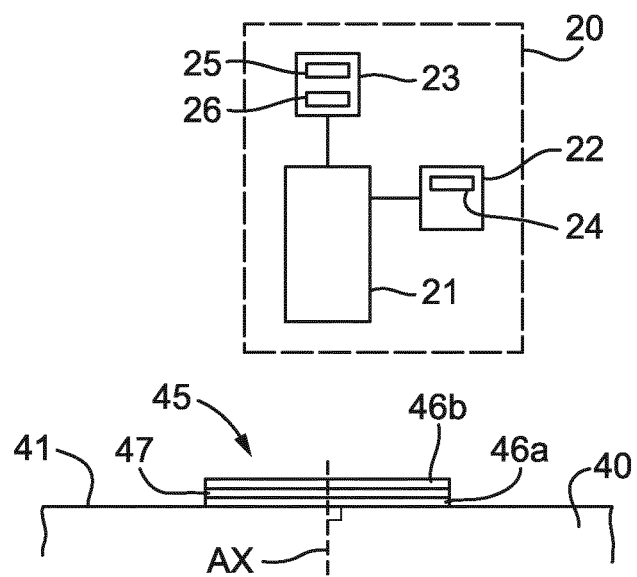
FIG. 6 depicts in side view a measurement system according to an embodiment.

In an embodiment, the target 45 further comprises at least one isolating layer 47, for example, as depicted in FIG. 6, the isolating layer 47 being arranged in-between each graphene layer to mechanically isolate the graphene layers from one another. The following embodiments comprising at least one isolating layer 47 may be the same as any of the above embodiments except for as herein described. The isolating layer 47 is configured to substantially mechanically isolate the graphene layers from one another. As such, ideally, each graphene layer (e.g. 46a) has no point of contact with another graphene layer (e.g. 46b). The isolating layer 47 is arranged to reduce or prevent tunneling of electrons from one graphene layer to another.

As described above for the graphene layer, providing a very thin graphene layer 46 (e.g. a mono-layer) and using a high frequency (e.g. in the GHz range) can provide an effective shield to prevent or reduce the generation of eddy currents in the object. However, there are significant benefits working in the sub-GHz frequency range (e.g. in the MHz range). Providing a target with graphene layers 46a and 46b separated by isolating layers 47 allows the skin depth $\delta$ to be reduced whilst limiting or reducing self heating even whilst using a lower frequency range, e.g. sub GHz. Preferably, at least one of the graphene layers 46a and 46b, or preferably all of the graphene layers, are mono-layers of graphene.

In this embodiment, the target 45 comprises two graphene layers 46a and 46b. The target 45 comprising multiple layers (i.e. at least one isolating layer and at least two graphene layers) may be referred to as a multilayer stack. The graphene layers 46a and 46b may be the same as the graphene layer 46 in any of the above embodiments. The isolating layer 47 of this embodiment is arranged in-between each graphene layer 46a and 46b to mechanically isolate the graphene layers 46a and 46b from one another. Further isolating layers and graphene layers may be included in the target 45. Preferably, the isolating layer(s) and graphene layers alternate with an isolating layer inbetween a graphene layer on either side, to mechanically isolate the graphene layers from each other.

In an embodiment, the isolating layer 47 may be made of at least one metal. The metal may be highly conductive and preferably is compatible with graphene such that the isolating layer 47 can be located adjacent to, and in contact with, the graphene layer on either side. In an embodiment, the isolating layer 47 comprises at least one of copper, silver, gold and/or aluminium and therefore, may be an alloy containing any of these materials. In an embodiment, the isolating layer 47 may comprise molybdenum disulphate.

The target 45 made up of the multilayer stack may have a thickness of less than or equal to approximately 5 µm, preferably in a range between approximately 0.5 µm to 2 µm, or more preferably below approximately 0.5 µm. The thickness of the multilayer stack refers to the sum of the thickness of all the layers comprising the multilayer stack. Additionally or alternatively, a thickness of the isolating layer is less than or equal to approximately 1000 nm, preferably in a range between approximately 0.1 nm to 100 nm, or more preferably in a range between approximately 1 nm to 10 nm. Additionally or alternatively, a thickness of the graphene layer is less than or equal to 1000 nm, preferably in a range between 0.1 nm to 100 nm, or more preferably in a range between 1 nm to 10 nm. The thickness of the graphene layers 46a and 46b may be substantially the same as each other. The thickness of the isolating layer 47 may be the same as one or both of the graphene layers 46a and 46b.

In an embodiment, the target 45 may comprise 5 to 150 graphene layers 46 (a or b) with the same number of isolating layers 47, preferably, the target 45 may comprise approximately 20 to 100 graphene layers with the same number of isolating layers. If the graphene layer 46 is adjacent to the object 40 (whether or not an adhesive is inbetween) then the target 45 comprising alternating graphene layers 46 (a or b) and isolating layers may have one more graphene layer 46 (a or b) than the number of isolating layers. If the isolating layer 47 is adjacent to the object 40 (whether or not an adhesive is inbetween), then the target 45 comprising alternating graphene layers 46 and isolating layers 47 may have one more isolating layer 47 than the number of graphene layers 46 (a or b).

In an embodiment, the outer surface of the target 45, in other words the surface of the target 45 facing the electromagnet 20, may be substantially parallel to a surface 41 of the object 40 on which the target 45 is located. In other words, the thickness of the target 45 made up of the multilayer stack is substantially uniform. In this instance, substantially uniform may include a variation of approximately 10% or less of the thickness of the target 45, or more preferably, the variation is approximately 5% or less.

In an embodiment, the thickness of the isolating layer 47 is preferably substantially uniform. In other words, the thickness of the isolating layer 47 does not vary substantially in cross section through the target 45, i.e. across the length or width of the target 45. In this instance, substantially uniform may include a variation of approximately 10% or less of the thickness of the multilayer stack, or more preferably, the variation is approximately 5% or less. In this embodiment, the thickness and variation of the graphene layer 46a and 46b may be as described in relation to the graphene layer 46 in earlier embodiments.

In an embodiment, the graphene layer 46a, graphene layer 46b and/or isolated layer 47 may be deposited on top of one another. For example, each layer may be deposited using chemical vapour deposition. Either of the graphene layers 46a and/or 46b, may be formed using any of the methods for graphene layer 46. The isolated layer 47 may be processed to achieve the desired thickness of each layer. For example, the deposition and/or processing may comprise exfoliating at least one of the layers, for example using a wedge-shaped tool, using adhesive tape, shearing, sonication, for example using a solvent, optionally with a surfactant, or two immiscible liquids, epitaxy, nanotube slicing, spin coating, supersonic spray, intercalation, using a laser, using microwave assisted oxidation and/or growing the layers on top of one another to form the target 45 on the object 40. The method of producing, depositing and/or processing the graphene layers 46a or 46 b or the isolating layer 47 is not limiting.

If for any reason, the isolating layer 47 and the graphene layers 46 are incompatible with each other, it may be necessary to additionally provide an adhesive. In an embodiment an adhesion promoting layer is deposited on the object 40 and the graphene layer 46 is deposited on the adhesion promoting layer. The surface of the object 40 may be treated by chemical or physical means prior to deposition of the graphene layer 46. The method of producing, depositing and/or processing the graphene layer 46 is not limiting.

In an embodiment providing an isolating layer 47 between graphene layers 46 means that the target 45 can be used to effectively reduce or prevent eddy currents in the object 40 below. Having an additional layer (i.e. by providing at least one the isolating layer) means that only several, or a single, layer of graphene may be used in the graphene layer 46, thus maintaining its high conductivity.

In an preferred embodiment, the electromagnetic sensor 20 may further comprise a graphene sensor layer 48 on the surface of the electromagnet 21. The graphene sensor layer 48 on the electromagnet 21 may be the same as the graphene layer 46 except as herein described. The graphene sensor layer 48 may have any or all of the advantages described in relation to the graphene layer 46. In particular, use of the graphene sensor layer 48 reduces (or prevents) losses due to heating in the graphene sensor layer 48 as in the target 45 due to the use of a highly conductive material. As such, the graphene sensor layer 48 reduces or prevents thermal drift of the skin depth thus improving the accuracy of the sensor. The graphene sensor layer 48 may differ from the graphene layer 46 of the target 45 in that it is located on the electromagnetic sensor 20 is not substantially uniform.

Figure 7A:
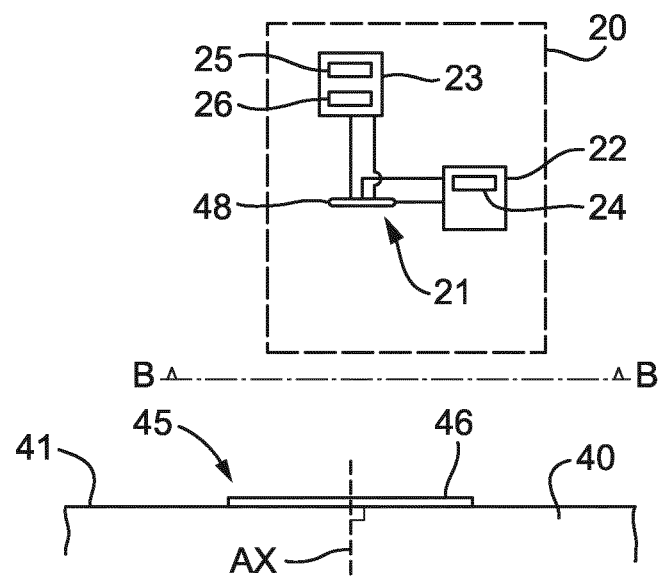
FIG. 7A depicts in side view a measurement system according to an embodiment.
Figure 7B:
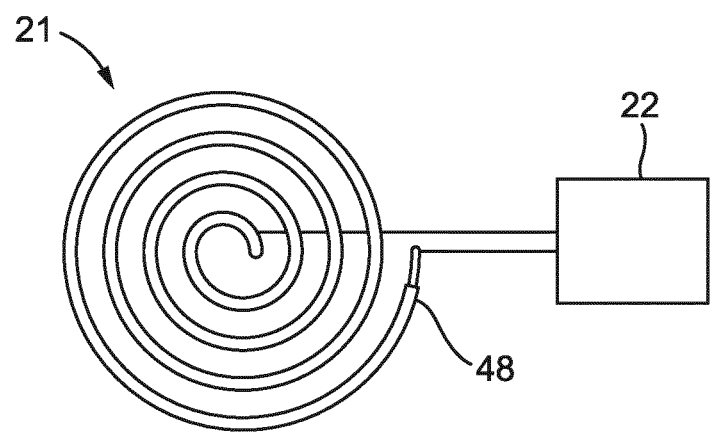
FIG. 7B depicts the electromagnet and the driving circuit of FIG. 7A in cross section B-B, in an upwards view.

As depicted in the exemplary embodiment shown in FIG. 7A, the electromagnet 21 may comprise a coil. A coil as herein described may be used (with or without the graphene sensor layer 48) in any of the above embodiments. As depicted in FIG. 7A, the coil may be a flat coil. An upwards view of the flat coil is depicted in FIG. 7B. FIGS. 7A and 7B are exemplary and the shape of the electromagnet 21 is not limiting. In an embodiment, a helical coil may be used. A helical coil may be used which has a longitudinal axis substantially perpendicular to the measurement axis AX. A flat coil, for example as depicted, may have better mechanical stability than a helical coil and it is advantageous in that all of the turns of the coil can be brought close to the target 45. In an embodiment, the electromagnetic sensor 20 may comprise a ferrite material around which the coil is wound. This is done to confine the alternating magnetic field AMF inside the ferrite material and avoid spreading of the alternating magnetic field AMF around the electromagnetic sensor 20. However, this type of coil may have low mechanical stability compared to the flat coil. Furthermore, ferrite materials have high permeability at low frequency (which helps to confine the magnetic field inside the ferrite material), but at higher frequencies (in the MHz range) the permeability drops considerably and the positive effect may disappear and the self-heating may increase.

The electromagnetic sensor depicted in FIGS. 7A and 7B comprises a graphene sensor layer 48 on the coil. In this embodiment, the graphene sensor layer 48 may be patterned on the coil. The pattern may be chosen to optimize the advantageous effects of the graphene sensor layer 48, e.g. to reduce or minimize thermal drift.

In an embodiment, the outer surface of the graphene sensor layer 48 on the surface of the electromagnetic 21 may have a roughness average RA which is less than approximately 100 nm, or preferably less than 10 nm. Generally, if the roughness average Ra is less than 10%, preferably less than 1%, of the distance between the target 45 and the electromagnet, the effect due to the roughness is negligible. The roughness of the surface of the graphene sensor layer 48 may affect transfer characteristics of the electromagnetic sensor 20.

In this embodiment, the measurement system may not comprise the target 45. In other words, a graphene sensor layer 48 of highly conductive material may be formed on the electromagnet 21, but not the object 40.

A further embodiment includes a method of measuring the position of the object 40 using the measurement system described in any of the above embodiments. The method comprises driving the electromagnet 21 to generate an alternating magnetic field AMF; positioning the electromagnetic sensor 20 relative to a target 45 on an object 40 such that the alternating magnetic field AMF interacts with the target 45 and changes the alternating magnetic field AMF, altering the electrical impedance parameter of the electromagnet 21, measuring an electrical impedance parameter of the electromagnet 21 and determining the position of the object 40 based on the electrical impedance parameter of the electromagnet 21.

Alternatively, the method may measure the position of the object without the target when using any one of the embodiments of the electromagnetic sensor 20 further comprising the graphene sensor layer 48. In this embodiment, the method may comprise the steps of: driving the electromagnet 21 to generate an alternating magnetic field AMF, positioning the sensor relative to an object 40 such that the alternating magnetic field AMF interacts with the object and changes the alternating magnetic field AMF, altering the electrical impedance parameter of the electromagnet, measuring an electrical impedance parameter of the electromagnet and determining the position of the object 40 based on the electrical impedance parameter of the electromagnet.

The measurement system of any of the above embodiments may be used to measure the position of various components of a lithographic apparatus. The lithographic apparatus may be used for manufacturing devices by projecting a beam patterned by a patterning device onto a substrate. Alternatively, the measurement system may be used outside of the lithographic field, where appropriate. In particular, the measurement system may be useful for measuring the position of any object, especially where a high degree of accuracy is required. For example, the measurement system may be used in any scientific and/or precision measurement system for example, electron microscopes, space equipment, etc.

Any of the above embodiments may comprise multiple measurement systems, which may be used to measure the position of the object 40 in different degrees of freedom. Multiple measurement systems may be used to determine if the object 40 is tilted. If multiple measurement systems are used, the processing unit 26 of each measurement system may be separate. However, at least one (but not necessarily all) of the processing units may be combined, for example in a single controller. Additionally or alternatively, the measurement system may be used with any other type of sensor. The measurement system may be integrated with another type of sensor system.

The object 40 of any of the above embodiments may be any object and is not particularly limiting. The measurement system may be particularly useful in lithographic apparatus due to the need for highly accurate position measurements. The object 40 may be any component of the lithographic apparatus, for example the patterning device, a component of the projection system and/or the illumination system, the projection system and/or the illumination system, or may be a support arranged to support a component which needs to be accurately positioned, for example the substrate table, the support table and/or the support structure. The object 40 may be a component used to move a support. The object 40 is not limited to components within the lithographic apparatus. In particular, one of the advantages of the electromagnetic sensor 20 as described is that environmental changes around the sensor generally have a small effect on the measurement such that the sensor may be used in many applications, in connection with a lithographic apparatus, or not.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A measurement system for measuring a position and/or displacement of an object using a sensor, the object having a surface with a target comprising a graphene layer that faces the sensor, comprising:
   an electromagnet;
   a driving circuit configured to drive the electromagnet to generate an alternating magnetic field; and
   a measuring circuit configured to measure an electrical impedance parameter of the electromagnet;
   wherein, when the alternating magnetic field interacts with the graphene layer of the target, the alternating magnetic field changes, thereby altering the electrical impedance parameter of the electromagnet.

2. The measurement system of claim 1, wherein the graphene layer consists of a mono-layer of graphene.

3. The measurement system of claim 1, wherein the graphene layer comprises multi-layers of graphene.

4. The measurement system of claim 1, wherein the target comprises at least two graphene layers and an isolating layer disposed between the at least two graphene layers.

5. The measurement system of claim 4, wherein a thickness of the isolating layer is one of: less than or equal to 1000 nm, between 0.1 nm to 100 nm, or between 1 nm to 10 nm.

6. The measurement system of claim 4, wherein a thickness of the graphene layer is one of: less than or equal to 1000 nm, between 0.1 nm to 100 nm, or between 1 nm to 10 nm.

7. The measurement system of claim 4, wherein the isolating layer is metal.

8. The measurement system of claim 7, wherein the isolating layer comprises at least one of copper, silver, gold, or aluminum.

9. The measurement system of claim 4, wherein the isolating layer comprises molybdenum disulphate.

10. The measurement system claim 1, wherein a measurement axis is defined as perpendicular to the surface of the object, and wherein a cross-sectional area of the target is larger than a cross-sectional area of the electromagnet, the cross-sectional area being in a plane perpendicular to the measurement axis.

11. The measurement system of claim 1, wherein the surface of the target that faces the sensor is substantially flat.

12. The measurement system of claim 4, wherein the thickness of the target is substantially uniform and varies one of: less than or equal to 10% from an average thickness of the target, or less than or equal to 5%.

13. The measurement system of claim 1, wherein the electromagnet further comprises a graphene sensor layer.

14. The measurement system of claim 13, wherein the graphene sensor layer on the electromagnet is patterned.

15. A method of measuring the position of an object using the measurement system of claim 1, the method comprising:
   driving the electromagnet to generate an alternating magnetic field;
   positioning the electromagnetic sensor relative to a target on the object such that the alternating magnetic field interacts with a graphene layer of the target and changes the alternating magnetic field, altering the electrical impedance parameter of the electromagnet;
   measuring an electrical impedance parameter of the electromagnet; and
   determining the position of the object based on the electrical impedance parameter of the electromagnet.

16. A method of measuring the position of an object using the measurement system of claim 1, the method comprising:
- driving the electromagnet to generate an alternating magnetic field;
- positioning the sensor relative to an object such that the alternating magnetic field interacts with a graphene layer of the object and changes the alternating magnetic field, altering the electrical impedance parameter of the electromagnet;
- measuring an electrical impedance parameter of the electromagnet; and
- determining the position of the object based on the electrical impedance parameter of the electromagnet.

* * * * *